(12) United States Patent
Aderhold et al.

(10) Patent No.: US 12,278,101 B2
(45) Date of Patent: Apr. 15, 2025

(54) CODED SUBSTRATE MATERIAL IDENTIFIER COMMUNICATION TOOL

(71) Applicant: Applied Materials, Inc., Santa Clara, CA (US)

(72) Inventors: Wolfgang Aderhold, Santa Clara, CA (US); Boris Axelrod, San Jose, CA (US); Maxim Shaposhnikov, Sunnyvale, CA (US); Dayal Ramachandran, Sunnyvale, CA (US); Bindusagar Marath Sankarathodi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 584 days.

(21) Appl. No.: 17/524,677

(22) Filed: Nov. 11, 2021

(65) Prior Publication Data

US 2023/0147976 A1    May 11, 2023

(51) Int. Cl.
  *G06F 16/907*    (2019.01)
  *G06N 20/00*    (2019.01)
  *H01L 21/02*    (2006.01)

(52) U.S. Cl.
  CPC ............ *H01L 21/02* (2013.01); *G06F 16/907* (2019.01); *G06N 20/00* (2019.01)

(58) Field of Classification Search
  CPC ........ H01L 21/02; G06F 16/907; G06N 20/00
  See application file for complete search history.

(56) References Cited

U.S. PATENT DOCUMENTS

| | | | |
|---|---|---|---|
| 6,352,870 B1 * | 3/2002 | Lansford | H01L 22/26 257/E21.528 |
| 7,539,552 B2 | 5/2009 | McIntyre et al. | |

(Continued)

FOREIGN PATENT DOCUMENTS

| | | |
|---|---|---|
| CN | 112270394 3 | 7/2021 |
| JP | 3255932 B2 * | 2/2002 |

(Continued)

OTHER PUBLICATIONS

International Search Report and Written Opinion for PCT/US2022/046746 dated Feb. 22, 2023, 10 pgs.

(Continued)

*Primary Examiner* — Santosh R Poudel
(74) *Attorney, Agent, or Firm* — Schwabe, Williamson & Wyatt, P.C.

(57) ABSTRACT

Embodiments disclosed herein include methods of processing substrates in a tool. In an embodiment, the method of processing the substrate in the tool, comprises receiving an augmented recipe with a machine learning (ML) and/or an artificial intelligence (AI) module. In an embodiment, the augmented recipe comprises, a recipe for processing the substrate in the tool, and a matrix identifier that corresponds to one or more substrate properties. In an embodiment the method further comprises using the ML and/or AI module to retrieve a data set from a database, where the data set is associated with the matrix identifier, and using the ML and/or AI module to modify the augmented recipe to form a modified recipe, where the modification is dependent on the data set.

17 Claims, 6 Drawing Sheets

(56) References Cited

U.S. PATENT DOCUMENTS

| | | | |
|---|---|---|---|
| 2009/0089024 A1* | 4/2009 | Huang | G05B 19/41865 703/2 |
| 2011/0264252 A1 | 10/2011 | Ashizawa et al. | |
| 2017/0232294 A1* | 8/2017 | Kruger | G09B 19/003 434/247 |
| 2019/0087529 A1 | 3/2019 | Steingrimsson et al. | |
| 2020/0111689 A1* | 4/2020 | Banna | G05B 13/048 |
| 2021/0124661 A1* | 4/2021 | Rafey | G06F 11/3006 |
| 2021/0270673 A1* | 9/2021 | Thompson | H01J 37/32422 |
| 2023/0023762 A1* | 1/2023 | Kim | G05B 19/41865 |

FOREIGN PATENT DOCUMENTS

| | | |
|---|---|---|
| TW | 202119138 A | 5/2021 |
| WO | 2021081213 A1 | 4/2021 |

OTHER PUBLICATIONS

International Preliminary Report on Patentability for PCT/US2022/046746 dated May 23, 2024, 7 pgs.
Official Letter for Taiwan Patent Application No. 111139805 dated Feb. 11, 2025, 18 pgs.

* cited by examiner

CODED SUBSTRATE MATERIAL IDENTIFIER COMMUNICATION TOOL

BACKGROUND

1) Field

Embodiments relate to the field of semiconductor manufacturing and, in particular, to a coded substrate material identifier system that is used to categorize substrates with a matrix instead of proprietary information.

2) Description of Related Art

In semiconductor processing, machine learning (ML) and artificial intelligence (AI) are increasingly being used in order to process substrates (e.g., semiconductor wafers) with improved uniformity and process control. In order to provide improved performance with the ML and AI modules, context information from the substrates is supplied to the ML and AI modules. For example, context information may include substrate properties (e.g., thickness, reflectivity, resistivity, etc.) or process history. However, providing the context information to the ML and/or AI module is not always possible. For example, intellectual property restrictions may require that no identifiable context information be provide to the ML and/or AI module. Accordingly, existing information distribution restrictions result in suboptimal use of ML and/or AI modules.

SUMMARY

Embodiments disclosed herein include methods of processing substrates in a tool. In an embodiment, the method of processing the substrate in the tool, comprises receiving an augmented recipe with a machine learning (ML) and/or an artificial intelligence (AI) module. In an embodiment, the augmented recipe comprises, a recipe for processing the substrate in the tool, and a matrix identifier that corresponds to one or more substrate properties. In an embodiment the method further comprises using the ML and/or AI module to retrieve a data set from a database, where the data set is associated with the matrix identifier, and using the ML and/or AI module to modify the augmented recipe to form a modified recipe, where the modification is dependent on the data set.

Additional embodiments include a method for building a database used by a machine learning (ML) and/or artificial intelligence (AI) module for processing substrates without knowing underlying substrate properties. In an embodiment, the method comprises associating a matrix identifier with a first substrate, where the matrix identifier corresponds to one or more substrate properties of the first substrate, processing the first substrate in a tool, and storing sensor data from the tool during processing of the first substrate in the database, where the sensor data is associated with the matrix identifier.

Embodiments may also include a semiconductor processing tool. In an embodiment, the tool comprises, a host computer, and an artificial intelligence (AI) and/or machine learning (ML) module communicatively coupled to the host computer. In an embodiment, the tool further comprises a database communicatively coupled to the AI and/or ML module, and a processing chamber. In an embodiment, the processing chamber is operated in accordance with a recipe that is selected by the host computer and modified by the AI and/or ML module in view of a data set within the database.

DETAILED DESCRIPTION

Systems described herein include a method and apparatus for measuring radicals in a coded substrate material identifier system that is used to categorize substrates with a matrix instead of proprietary information. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, machine learning (ML) and/or artificial intelligence (AI) modules work with improved effectiveness when context information is provided for the substrate that is being processed in a semiconductor processing tool. However, such context information may not be able to be shared with the ML and/or AI module due to intellectual property restrictions. For example, the manufacturing facility may be a first party, the substrate being processed may be owned by a second party, and the ML and/or AI module may be a third party application. Intellectual property restrictions may require that substrate parameter information be kept between the first party and the second party.

Accordingly, embodiments disclosed herein include building a database that includes substrate processing data that is associated with a matrix identifier instead of the underlying substrate properties. Such a database may be populated by using a matrix generator to assign a matrix identifier to a recipe for a substrate before the recipe is delivered to the ML/AI module. Substrate processing data from the processing of the substrate can be stored in the database using the matrix identifier to categorize the processing data.

After the database is populated, the ML/AI module may use the data from the database to refine processing parameters of a recipe in order to more tightly control uniformity and tolerances of a process. For example, the ML/AI module may receive an augmented process recipe from the host computer. The augmented process recipe includes the process recipe operations and a matrix identifier that is associated with the substrate to be processed. The ML/AI module may then query the database for a set of data corresponding to the matrix identifier. The ML/AI module may use this information in order to modify the process recipe operations to improve processing uniformity and/or tolerance control. In this way, the ML/AI module can utilize historical data without needing to know the underlying substrate properties, which may include sensitive intellectual property information.

Figure 1:
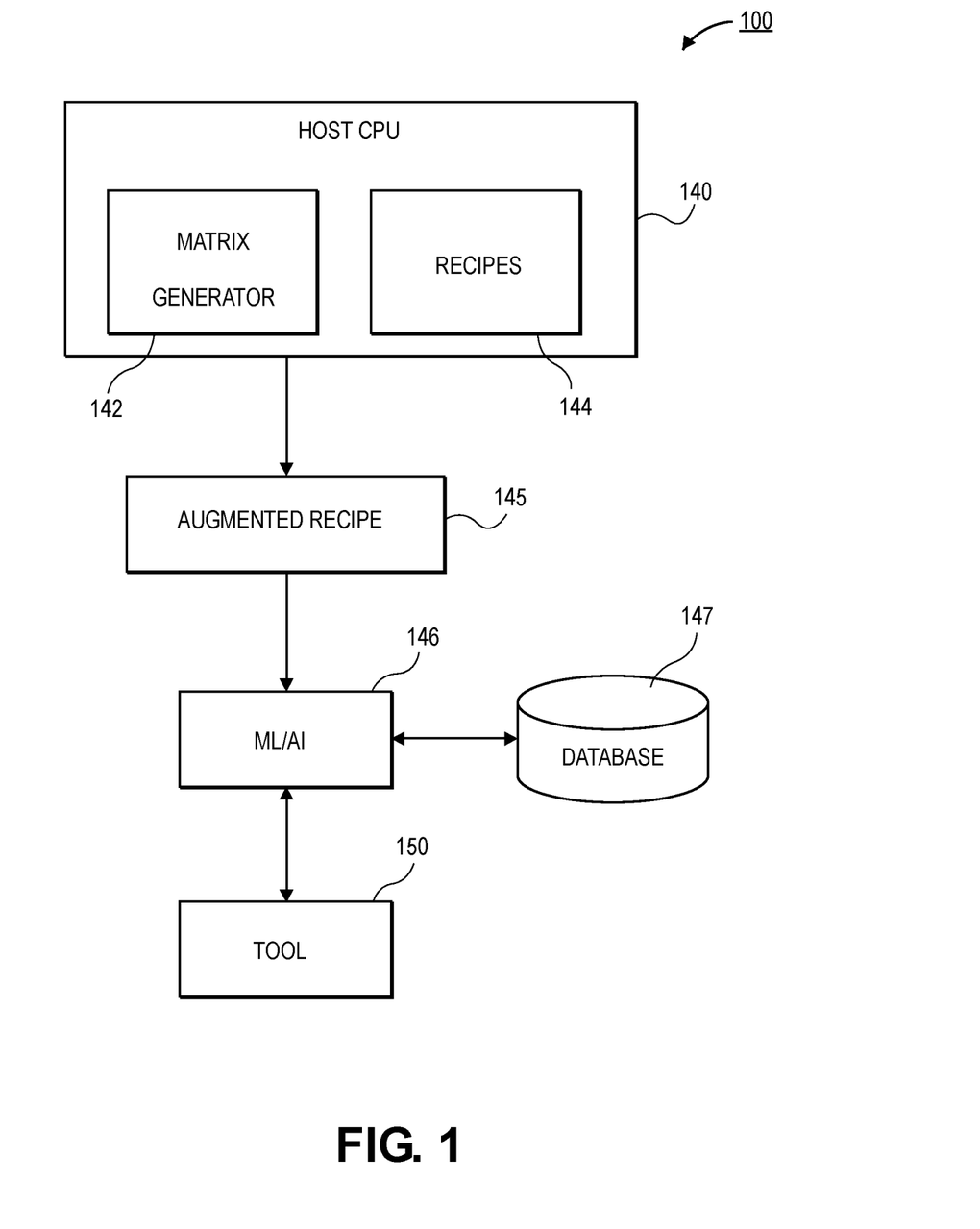
FIG. 1 is a schematic illustration of a processing tool that includes a host computer that interfaces with a machine learning (ML) and/or artificial intelligence (AI) module in order to control processing recipes executed in a processing tool, in accordance with an embodiment.

Referring now to FIG. 1, a block diagram of a semiconductor processing tool 100 is shown, in accordance with an embodiment. In an embodiment, the processing tool 100 may include a host computer 140. In an embodiment, the host computer 140 may be any computer or server platform within a semiconductor facility. In some embodiments, the host computer 140 is dedicated for the control of a single tool 150. In other embodiments, the host computer 140 may provide control to a plurality of tools 150.

In an embodiment, the host computer 140 may include a matrix generator 142. The matrix generator 142 is responsible for associating individual substrates with a matrix identifier. The matrix identifier is a matrix that allows for the numerical categorization of one or more underlying substrate properties. In order to make the proper assignments, the matrix generator 142 may have access to the underlying substrate properties. In some embodiments, the matrix identifier comprises a matrix with a single row and a plurality of columns. Each column may refer to a different substrate property. The value in each column may be any numeral. For example, the value in each column may be between 0 and 1,000, though larger values may also be used in some embodiments. In a particular embodiment, ten columns are provided, though it is to be appreciated that any number of columns may be used in various embodiments.

In an embodiment, the substrate properties that are represented by the matrix identifier may be any substrate property that, if known, may be useful for processing a substrate. For example, substrate properties may include one or more of a material type (e.g., Si, SiO2, SiC, Poly-Si, etc.), a resistivity, a substrate thickness, a substrate surface reflectance, a chip layout, a chip size, a chip uniformity, a number of times the substrate has been processed with the recipe, and a position in a lot of substrates. While some substrate properties are listed, it is to be appreciated that any number of substrate properties may be represented with a matrix identifier.

In an embodiment, the substrate property may be categorized as a numerical value within the matrix. For example, the resistivity of the substrate may be broken into a series of ranges. A resistivity below 0.03 Ohm-cm may be given the value 1, a resistivity between 0.03 Ohm-cm and 0.1 Ohm-cm may be given the value 2, a resistivity between 0.1 Ohm-cm and 10 Ohm-cm may be given the value 3, and a resistivity greater than 10 Ohm-cm may be given the value 4. While resistivity is provided as one example, it is appreciated that any substrate property may be assigned numbers in a similar fashion.

Additionally, the substrate properties may refer to categorical properties instead of a range of values. For example, the substrate layout may be categorized as either sparse or dense. If the substrate layer is sparse, a value of 1 may be used in the matrix identifier. Alternatively, if the substrate layout is dense, a value of 2 may be used in the matrix identifier. In this way substrate properties that are numerical values or categorical identifiers can be represented in the matrix identifier.

In an embodiment, the host computer 140 may also have access to recipes 144 for processing the substrates. The host computer 140 selects the proper recipe 144 for a given substrate, and the host computer 140 uses the matrix generator 142 to generate a matrix identifier that can be added to the recipe 144. The generated matrix identifier corresponds to substrate properties of the substrate being processed with the recipe 144. The resulting recipe may be referred to as an augmented recipe 145 in some embodiments. This is because additional information has been added to the recipe 144 to aid in the processing of the substrate.

In an embodiment, the augmented recipe 145 is delivered to a machine learning and/or artificial intelligence module 146 (ML/AI module 146 for short). The ML/AI module 146 may not have access to the underlying substrate properties of the substrate to be processed. Instead, the ML/AI module 146 uses the matrix identifier in the augmented recipe 145 in order to select data sets useful for improving the processing of the substrate. The data used by the ML/AI module 146 may be stored in a database 147. The data stored in the database 147 may be categorized using the matrix identifier values instead of the underlying substrate properties. As such, the ML/AI module 146 may select a set of data that corresponds to the matrix identifier provided in the augmented recipe 145.

In an embodiment, the database 147 may be populated with sensor data from the processing of one or more substrates. The sensor data may include control loop sensor data in some embodiments. That is, data used in the control loop of processing a substrate may be used. Other data sources may also be used. For example, witness sensors (e.g., physical or virtual) may be used to provide additional data for the database 147. In some embodiments, metrology data obtained subsequent to processing substrates may also be provided in the database 147. A process for populating the data in the database 147 is provided in greater detail below.

The ML/AI module 146 may utilize the data from the database 147 to alter the augmented recipe 145. For example, historical data from substrates with a similar (or same) matrix identifier may be used in order to change processing conditions in order to provide more uniform process outcomes, a process with tighter tolerances, or any other improved substrate outcome.

In an embodiment, the ML/AI module 146 may be communicatively coupled with a processing tool 150. The processing tool 150 may be any semiconductor processing tool. For example, the processing tool 150 may include a radical oxidation tool, a plasma tool (e.g., for etching, deposition, or surface treatments), or the like.

Figure 2:
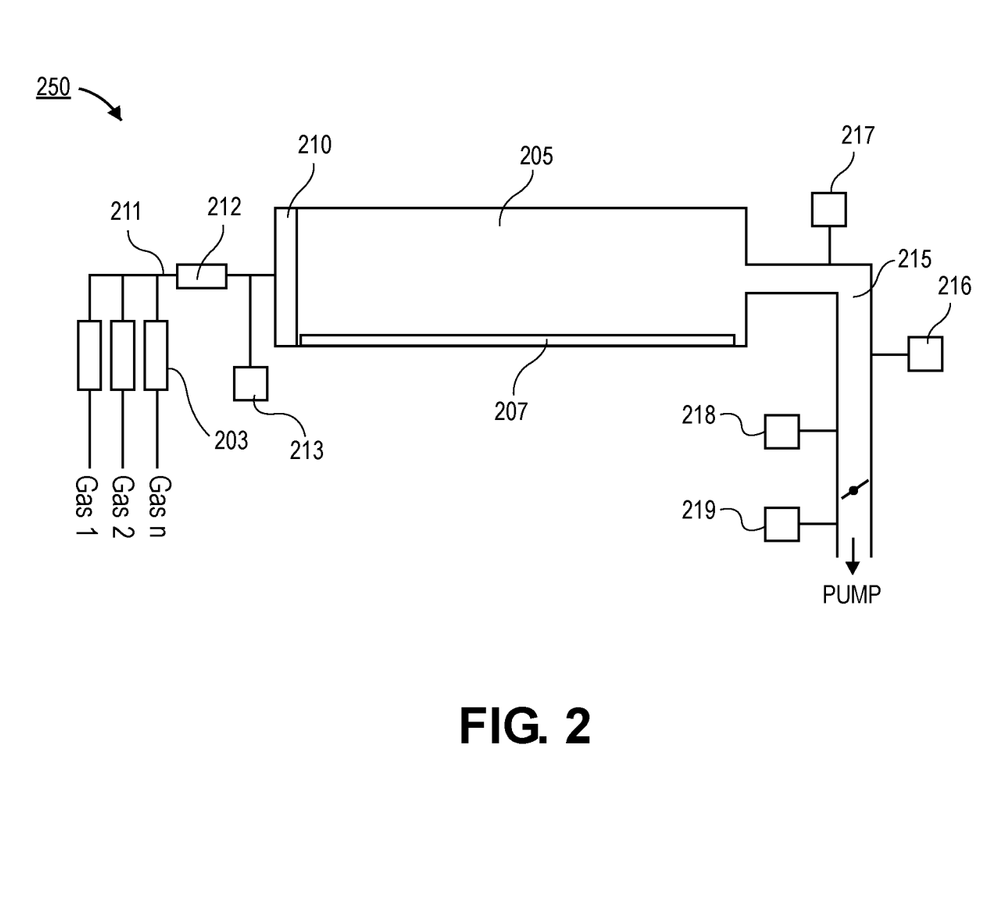
FIG. 2 is a cross-sectional illustration of a processing tool with control loop sensors and witness sensors, in accordance with an embodiment.

In a particular embodiment shown in FIG. 2, schematic of a radical oxidation tool 250 is shown, in accordance with an embodiment. The tool 250 illustrates the hardware components that may be utilized in one or more of the processing tools 150 described above with respect to FIG. 1. In the illustrated embodiment, the tool 250 described is a lamp based chamber for a radical oxidation process. However, it is to be appreciated that the processing tool 250 is exemplary in nature and embodiments disclosed herein may be suitable for use in conjunction with other processing tools, such as, but not limited to heater based chambers, or plasma based chambers. Those skilled in the art will recognize that the placement of sensors, the number of sensors, and the types of sensors may be modified in order to track desired processing parameters of the various types of processing tools.

In an embodiment, the tool 250 comprises a chamber 205. The chamber 205 may be a chamber suitable for providing a sub-atmospheric pressure in which a substrate (e.g., a semiconductor wafer) is processed. In an embodiment, the chamber 205 may be sized to accommodate a single substrate or a plurality of substrates. Semiconductor substrates suitable for processing in the chamber 205 may include silicon substrates, or any other semiconductor substrate. Other substrates, such as glass substrates, may also be processed in the chamber 205.

In an embodiment, a gas distribution network feeds gas from one or more gas sources (e.g., Gas 1, Gas 2, Gas n, etc.) to a cartridge 210. In a particular embodiment the gas sources may comprise one or more of oxygen, hydrogen, and nitrogen. While three gas sources are shown in FIG. 2, it is to be appreciated that embodiments may include one or more gas sources. The cartridge 210 may include an inlet for receiving gas from line 211 and outlets for distributing the gas into the chamber 210. In the illustrated embodiment, the cartridge 210 is shown as feeding the gas into the chamber from a side of the chamber 210. However, it is to be appreciated that the cartridge 210 may optionally feed the gas into the chamber from above or below the chamber. In some embodiments, the cartridge 210 may also be referred to as a showerhead, particularly in cases where the processing tool is a plasma generating tool.

In an embodiment, the flow of each of the processing gasses may be controlled by separate mass flow controllers (MFCs) 203. In an embodiment, the MFCs 203 may be part of the control loop sensor group. The MFCs 203 control the flow of gas into a input line 211. In an embodiment, a mass flow meter (MFM) 212 is provided on the upstream side of the cartridge 210. The MFM 212 allows for the actual flow from the source gasses to be measured. Also included on the upstream side of the cartridge 210 is a pressure gauge 213. The pressure gauge 213 allows for the pressure of the input line 211 to be measured. The MFM 212 and the pressure gauge 213 may be considered witness sensors since they are outside of the control loop.

In an embodiment, a chamber pressure gauge 217 may be provided to measure a pressure in the chamber 205. The chamber pressure gauge 217 may be part of the control loop sensor group. In an embodiment, additional witness sensors are provided along an exhaust line 215 of the processing tool 200. The additional sensors may comprise a leak detection sensor 216 and additional pressure gauges 218 and 219. The leak detection sensor 216 may include a self-contained plasma optical emission spectroscopy (OES) device to measure oxygen that leaks into the chamber 205. The pressure gauges 218 and 219 may be on an upstream side and a downstream side of a throttle valve 214, respectively.

In an embodiment, the witness sensors (e.g., 212, 213, 216, 218, and 219) may be used to provide monitoring of chamber drift. For example, the control loop sensors (e.g., 203 and 217) may become miscalibrated during use of the processing tool 200. As such, the readings of the control loop sensors 203, 217 may remain constant while the outcome on the wafer (e.g., deposition rate of a film) changes. In such an instance, the outputs of the witness sensors will change to indicate that the chamber has drifted.

In an additional embodiment, the witness sensors may be leveraged to implement virtual sensors in the chamber 205. Virtual sensors may refer to a sensor that provides outputs that are computationally generated, as opposed to direct readings of a physical value (as is the case for physical sensors). Virtual sensors are therefore powerful for determining conditions within the processing tool 200 that are difficult or impossible to measure with conventional physical sensors.

In one embodiment, a virtual sensor may be used to determine a flow rate of processing gasses at the exit of the cartridge 210. Calculating the flow rate at the cartridge 210 is a valuable metric that can be used to control the deposition rate and/or deposition uniformity of a film on the wafer. In a particular embodiment, the flow rate at the cartridge 210 may be calculated using a Bernoulli equation with the variables supplied by using the outputs of the MFM 212, the pressure gauge 213, the pressure gauge 217, and the known geometry of the cartridge 210. While an example of flow rate at the cartridge is provided, it is to be appreciated that other unknowns within the processing tool 200 may be determined using virtual sensor calculations. For example, unknowns such as, but not limited to gas composition at various locations in a chamber, deposition rate across a wafer, pressure across a wafer, and film composition across a wafer may be determined using virtual sensor implementations.

In an embodiment, one or more temperature sensors 207 are provided in the chamber 205. For example, the temperature sensors 207 may be thermocouples or the like. In an embodiment, the temperature sensors 207 may be provided on a reflector plate (not shown) of the chamber. The temperature sensors 207 may be considered witness sensors in some embodiments. That is, the temperature sensors 207 may be outside of the control loop.

Temperature sensors 207 may provide an additional known variable to enable more extensive virtual sensor implementations. In an embodiment, the temperature sensors 207 may also be used in determining when a steady state has been reached in the chamber 205. This is particularly beneficial when bringing the processing tool 200 up from a cold state, such as ramping up the processing tool 250 after a maintenance event. For example, the output of the temperature sensors 207 in combination with one or more pressure gauges 213, 217, 218, and 219, and the angle of the throttle valve 214 may be monitored, and the chamber can be ready for use when a steady state of the various sensors is reached. In an embodiment, monitoring when the chamber reaches a steady state is useful because it eliminates the scrap or rework of wafers typically experienced due to first wafer effects in a processing tool.

As can be appreciated, the multitude of sensors (e.g., control loop sensors, witness sensors, virtual sensors, etc.) can be used to provide a highly detailed picture of the processing conditions for the processing of various substrates. When the substrate properties are associated with the processing conditions using a matrix identifier, a database with rich detail can be generated. The database can be subsequently used by a ML/AI module in order to improve the processing of substrates without needing to provide the underlying substrate properties to the ML/AI module. As such, the benefits of ML/AI modules can be obtained without sharing substrate information that may be subject to intellectual property controls that limit sharing of the underlying substrate data.

Figure 3:
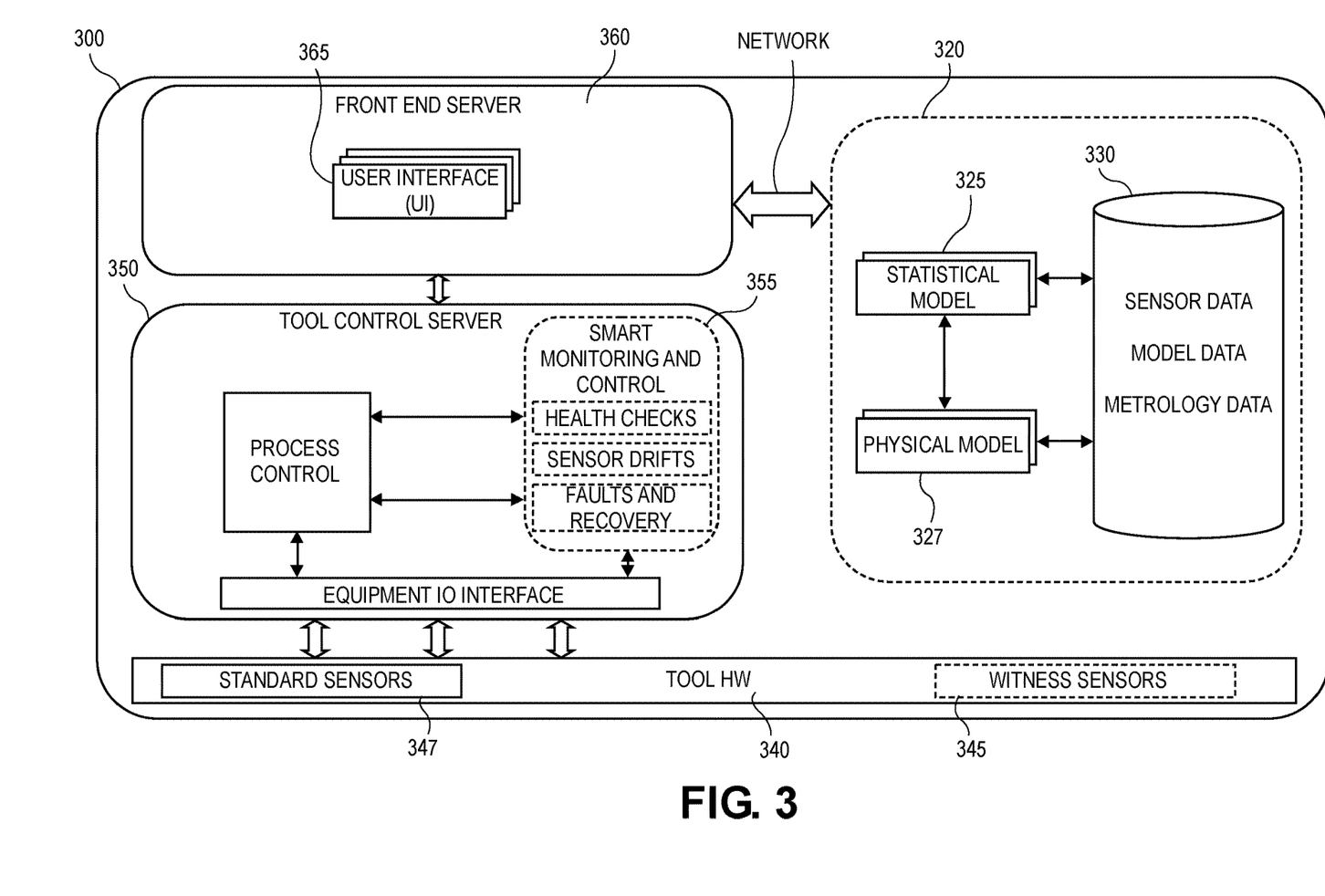
FIG. 3 is a block diagram of a semiconductor processing tool, in accordance with an embodiment.

Referring now to FIG. 3, a schematic of a processing tool 300 is shown, in accordance with an embodiment. As shown, an ML/MI module 320 may be integrated with the processing tool 300. For example, the ML/AI module 320 may be communicatively coupled to a front end server 360 by a network connection, as indicated by the arrow. However, in other embodiments, the ML/AI module 320 may be external to the processing tool 300. For example, ML/AI module 320 may be communicatively coupled to the processing tool 300 through an external network or the like.

In an embodiment, the ML/AI module 320 may comprise a hybrid model. The hybrid model may comprise a physical model 327 and a statistical model 325. The statistical model 325 and the physical model 327 may be communicatively coupled to a database 330 for storing input data (e.g., sensor data, model data, metrology data, etc.) used to build and/or update the statistical model 325 and the physical model 327. In an embodiment, the statistical model 325 may be generated by implementing a physical DoE and use interpolation to provide an expanded process space model. In an embodiment, the physical model 327 may be generated using real world physics and chemistry relationships. For example, physics and chemistry equations for various interactions within a processing chamber may be used to build the physical model.

In a particular embodiment, the physical model 327 and the statistical model 325 may be informed by one or more substrate properties. For example, different substrate properties may result in differences to the physical model 327 and/or the statistical model 325. In some embodiments, the particular substrate properties (e.g., resistivity, thickness, etc.) are not known by the physical model 327 and the statistical model 325. Instead, the substrate properties are converted into values within a matrix identifier, such as those described above.

In an embodiment, the processing tool 300 may comprise a front end server 360, a tool control server 350, and tool hardware 340. The front end server 360 may comprise a dashboard 365 for the ML/AI module 320. The dashboard 365 provides an interface for a process engineer to utilize the data modeling in order to execute various operations, such as augmenting process recipes.

The tool control server 350 may comprise a smart monitoring and control block 355. The smart monitoring and control block 355 may comprise modules for providing diagnostics and other monitoring of the processing tool 300. Modules may include, but are not limited to health checks, sensor drift, fault recovery, and leak detection. The smart monitoring and control block 355 may receive data from various sensors implemented in the tool hardware as inputs. The sensors may include standard sensors 347 that are generally present in semiconductor manufacturing tools 300 to allow for operation of the tool 300. For example, the sensors 347 may include control loop sensors such as those described above. The sensors may also include witness sensors 345 that are added into the tool 300. The witness sensors 345 provide additional information that is necessary for the building of highly detailed data models. For example, the witness sensors may include physical sensors and/or virtual sensors. As noted above, virtual sensors may utilize the data obtained from two or more physical sensors and use calculations in order to provide additional sensor data not obtainable from physical sensors alone. Generally, witness sensors may include any type of sensor, such as, but not limited to, pressure sensors, temperature sensors, and gas concentration sensors. In an embodiment, the smart monitoring and control block 355 may provide data that is used by the ML/AI module 320. In other embodiments, output data from the various witness sensors 345 may be provided directly to the ML/AI module 320.

Figure 4:
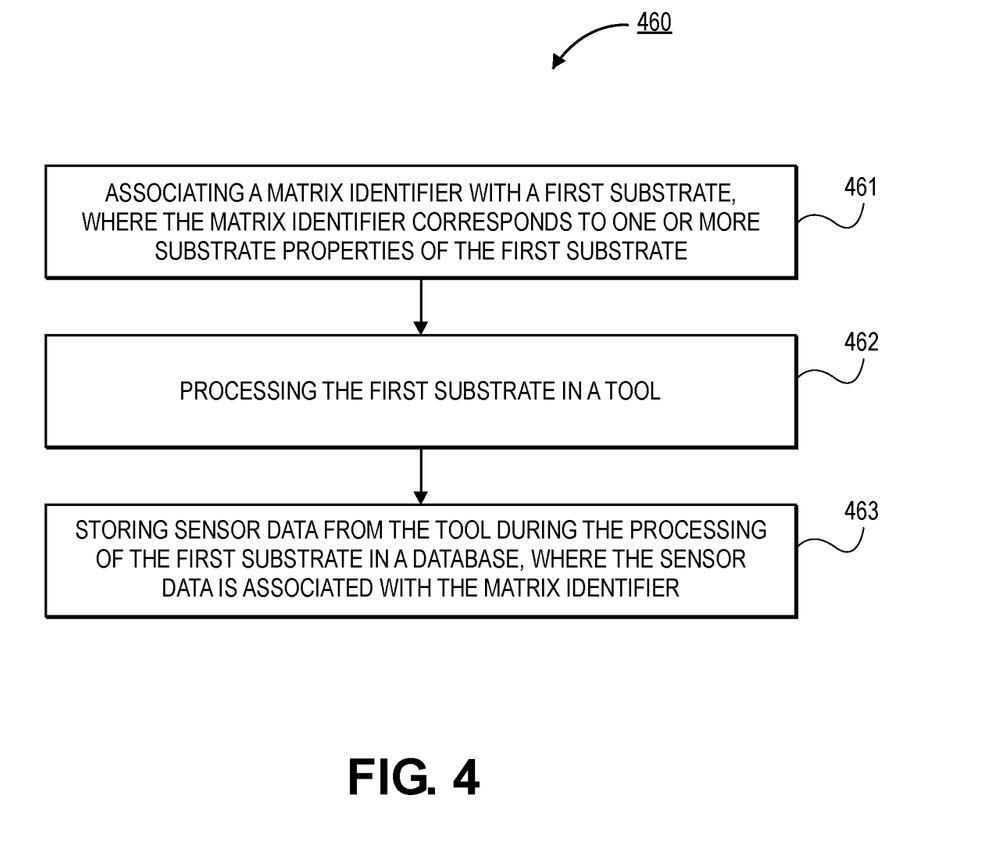
FIG. 4 is a flow diagram of a process for building a database with matrix identifiers categorizing process data, in accordance with an embodiment.

Referring now to FIG. 4, a flow diagram of a process 460 for building a database for use with ML/AI modules is shown, in accordance with an embodiment. In an embodiment, the process 460 may begin with operation 461, which includes associating a matrix identifier with a first substrate. In an embodiment, the matrix identifier corresponds to one or more substrate properties of the first substrate.

In an embodiment, the matrix identifier may be generated by a matrix generator in the host computer, as described in greater detail above. That is, the host computer may have access to the underlying substrate properties of the first substrate, and can generate a matrix identifier that is associated with the underlying substrate properties of the first substrate.

In some embodiments, the matrix identifier comprises a matrix with a single row and a plurality of columns. Each column may refer to a different substrate property. The value in each column may be any numeral. For example, the value in each column may be between 0 and 1,000, though larger values may also be used in some embodiments. In a particular embodiment, ten columns are provided, though it is to be appreciated that any number of columns may be used in various embodiments.

In an embodiment, the substrate properties that are represented by the matrix identifier may be any substrate property that, if known, may be useful for processing a substrate. For example, the substrate properties may include one or more of a material type (e.g., Si, SiO2, SiC, Poly-Si, etc.), a resistivity, a substrate thickness, a substrate surface reflectance, a chip layout, a chip size, a chip uniformity, a number of times the substrate has been processed with the recipe, and a position in a lot of substrates. While some substrate properties are listed, it is to be appreciated that any number of substrate properties may be represented with a matrix identifier.

In an embodiment, the substrate property may be categorized as a numerical value within the matrix. For example, the resistivity of the substrate may be broken into a series of ranges. A resistivity below 0.03 Ohm-cm may be given the value 1, a resistivity between 0.03 Ohm-cm and 0.1 Ohm-cm may be given the value 2, a resistivity between 0.1 Ohm-cm and 10 Ohm-cm may be given the value 3, and a resistivity greater than 10 Ohm-cm may be given the value 4. While resistivity is provided as one example, it is appreciated that any substrate property may be assigned numbers in a similar fashion.

Additionally, the substrate properties may refer to categorical properties instead of a range of values. For example, the substrate layout may be categorized as either sparse or dense. If the substrate layer is sparse, a value of 1 may be used in the matrix identifier. Alternatively, if the substrate layout is dense, a value of 2 may be used in the matrix identifier. In this way substrate properties that are numerical values or categorical identifiers can be represented in the matrix identifier.

In an embodiment, process 460 may continue with operation 462, which comprises processing the first substrate in a tool. In an embodiment, the tool may include any tool suitable for processing semiconductor substrates or the like. For example, the tool may be a radical oxidation tool, a plasma tool, or the like. In an embodiment, the tool may include control loop sensors and witness sensors (e.g., physical witness sensors or virtual witness sensors).

In an embodiment, process 460 may continue with operation 463, which comprises storing sensor data from the tool during the processing of the first substrate in a database. In an embodiment, the sensor data is associated with the matrix identifier assigned to the first substrate. In this way, a unique identifier can be applied to the data for the first substrate, without needing to share the underlying substrate properties with the ML/AI module and/or database.

In an embodiment, operations 461-463 may be repeated with additional substrates. Each additional substrate may also be associated with a matrix identifier. In this way, many entries into the database may be made. Subsequent to the building of a database with sufficient information, the ML/AI module can references the stored data in order to modify recipes in order to improve processing outcomes.

While process 460 uses the processing of a plurality of substrates to build the database, some embodiments may include entering data from previously processed substrates in order to populate the database. In yet another embodiment, metrology data obtained after processing substrates may be added to the database as well.

Figure 5:
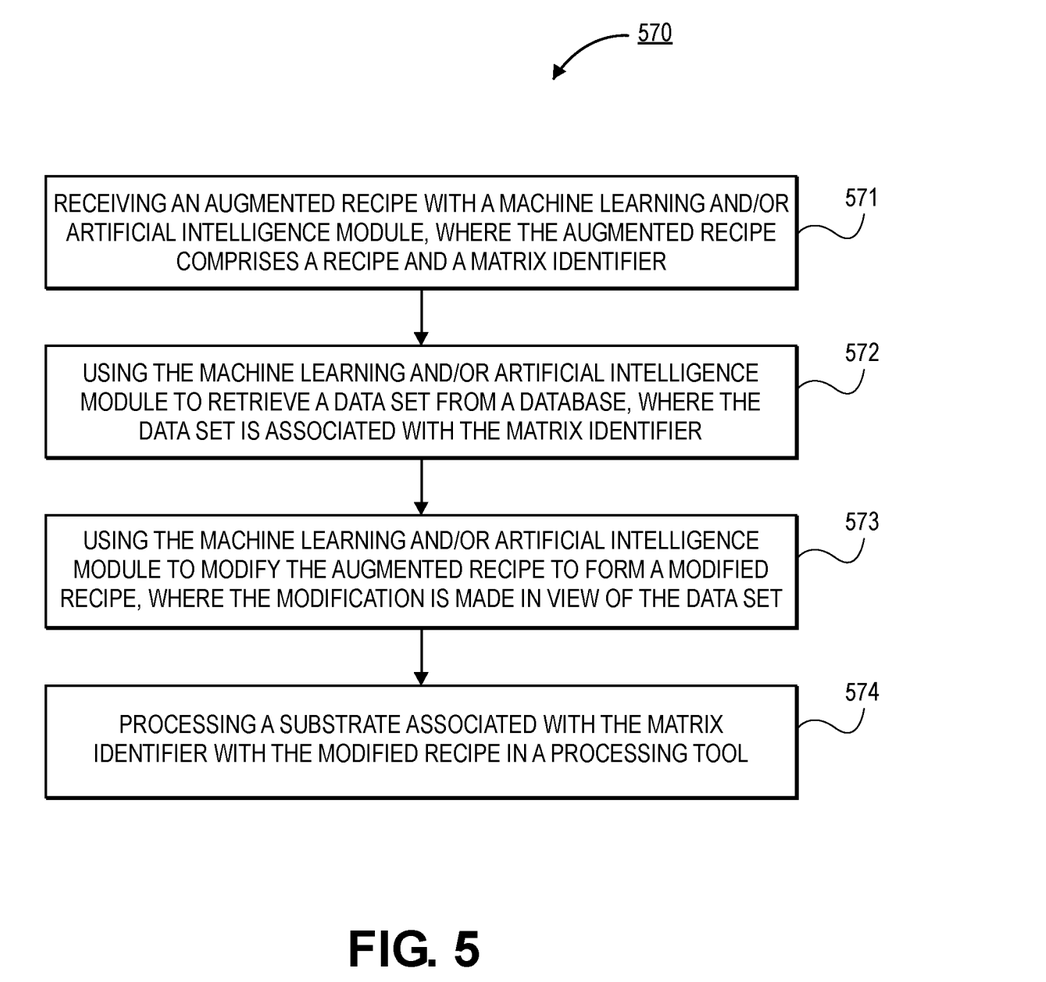
FIG. 5 is a flow diagram of a process for processing a substrate with a ML/AI module that utilizes matrix identifiers to select the proper reference data, in accordance with an embodiment.

Referring now to FIG. 5, a flow diagram of a process 570 for using matrix identifiers to process substrates using an ML/AI module is shown, in accordance with an embodiment. In an embodiment, process 570 begins with operation 571, which comprises receiving an augmented recipe with an ML/AI module. In an embodiment, the augmented recipe comprises a recipe for processing a first substrate and a matrix identifier that is associated with the first substrate. In an embodiment, the matrix identifier is added to the recipe by a host computer that has access to the underlying substrate properties of the first substrate. The matrix identifier includes one or more entries into a matrix that correspond to the underlying substrate properties. However, the underlying substrate properties themselves are not shared with the ML/AI module.

In an embodiment, the process 570 may continue with operation 572, which comprises using the ML/AI module to retrieve a data set from a database, where the data set is associated with the matrix identifier. In an embodiment, the data set may be associated with one or more entries of the matrix identifier that is associated with the first substrate. The data set may include historical sensor data (e.g., control loop sensor data, witness sensor data, and the like). In some embodiments, the data set may also include metrology data.

In an embodiment, the process 570 may continue with operation 573, which comprises using the ML/AI module to modify the augmented recipe to form a modified recipe. In an embodiment, the modification to the recipe is made in view of the data from the retrieved data set. For example, the retrieved data set may be used to change flowrates of various gasses, change temperatures, change pressures, and/or change durations of various processes, to name a few of the many possible changes to the recipe.

In an embodiment, the process 570 may continue with operation 574 which comprises processing the first substrate associated with the matrix identifier with the modified recipe in the processing tool. In an embodiment, data from the sensors of the processing tool may be provided back to the ML/AI module in order to store in the database to provide additional data for future processing.

Figure 6:
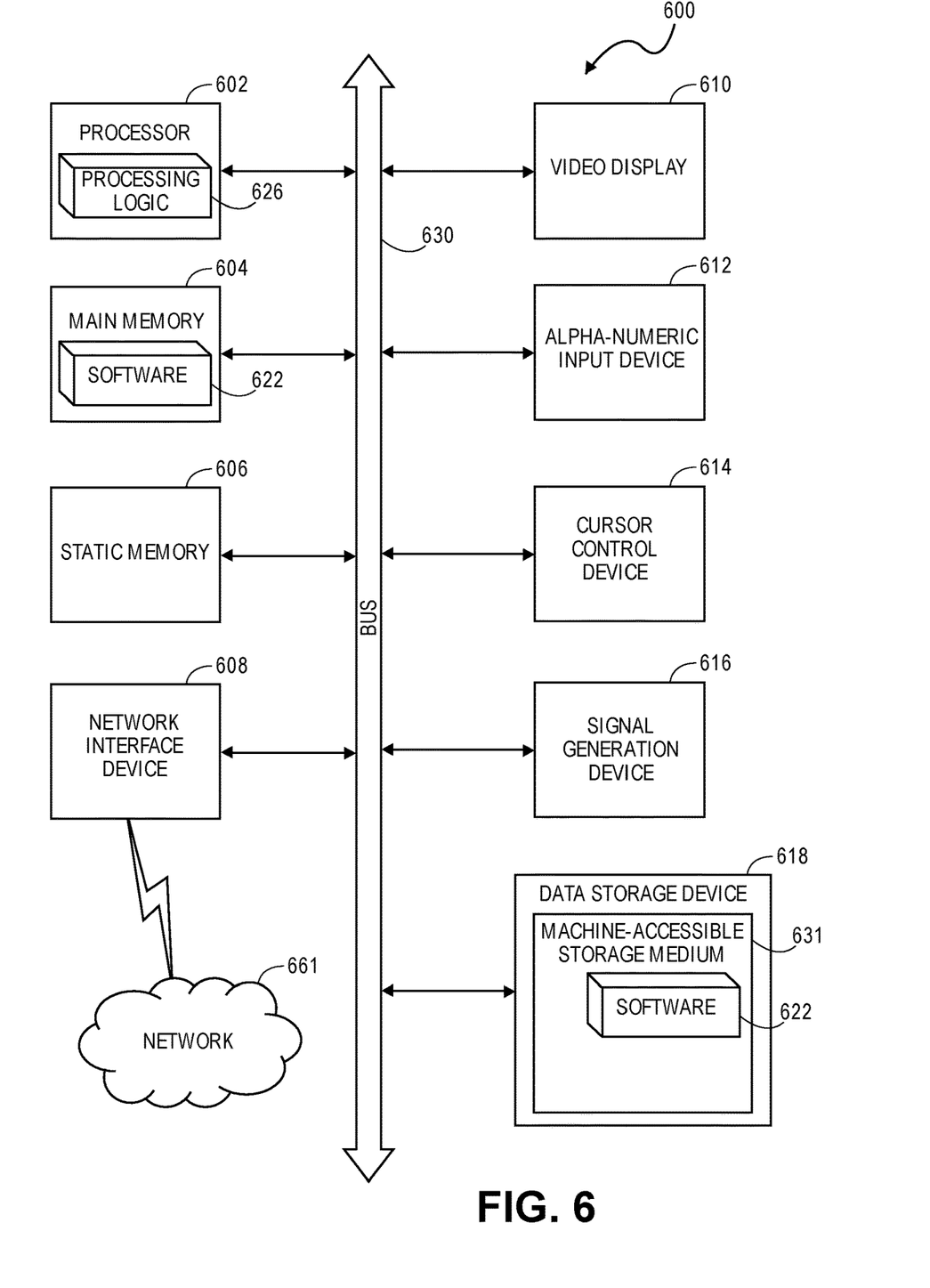
FIG. 6 illustrates a block diagram of an exemplary computer system that may be used in conjunction with a processing tool, in accordance with an embodiment.

Referring now to FIG. 6, a block diagram of an exemplary computer system 600 of a processing tool is illustrated in accordance with an embodiment. In an embodiment, computer system 600 is coupled to and controls processing in the processing tool. Computer system 600 may be connected (e.g., networked) to other machines in a Local Area Network (LAN), an intranet, an extranet, or the Internet. Computer system 600 may operate in the capacity of a server or a client machine in a client-server network environment, or as a peer machine in a peer-to-peer (or distributed) network environment. Computer system 600 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 600, the term "machine" shall also be taken to include any collection of machines (e.g., computers) that individually or jointly execute a set (or multiple sets) of instructions to perform any one or more of the methodologies described herein.

Computer system 600 may include a computer program product, or software 622, having a non-transitory machine-readable medium having stored thereon instructions, which may be used to program computer system 600 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 600 includes a system processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

System processor 602 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 602 may also be one or more special-purpose processing devices such as an application specific integrated circuit (ASIC), a field programmable gate array (FPGA), a digital signal system processor (DSP), network system processor, or the like. System processor 602 is configured to execute the processing logic 626 for performing the operations described herein.

The computer system 600 may further include a system network interface device 608 for communicating with other devices or machines. The computer system 600 may also include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium 632 (or more specifically a computer-readable storage medium) on which is stored one or more sets of instructions (e.g., software 622) embodying any one or more of the methodologies or functions described herein. The software 622 may also reside, completely or at least partially, within the main memory 604 and/or within the system processor 602 during execution thereof by the computer system 600, the main memory 604 and the system processor 602 also constituting machine-readable storage media. The software 622 may further be transmitted or received over a network 620 via the system network interface device 608. In an embodiment, the network interface device 608 may operate using RF coupling, optical coupling, acoustic coupling, or inductive coupling.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method of processing a substrate in a tool, comprising:
    receiving an augmented recipe with a machine learning (ML) and/or an artificial intelligence (AI) module, wherein the augmented recipe comprises:
      a recipe for processing the substrate in the tool; and
      a matrix identifier that corresponds to one or more substrate properties, wherein the matrix identifier comprises a matrix with a single row and a plurality of columns, and wherein each column represents a different context parameter;
    using the ML and/or AI module to retrieve a data set from a database, wherein the data set is associated with the matrix identifier;
    using the ML and/or AI module to modify the augmented recipe to form a modified recipe, wherein the modification is dependent on the data set; and
    operating the tool using the modified recipe.

2. The method of claim 1, wherein the plurality of columns includes at least ten columns.

3. The method of claim 1, wherein a plurality of the plurality of columns are populated with an indicator.

4. The method of claim 3, wherein the indicator is a number between 1 and 1,000.

5. The method of claim 1, wherein the matrix identifier provides a context parameter for one or more of: material type, a resistivity, a substrate thickness, a substrate surface reflectance, a chip layout, a chip size, a chip uniformity, a number of times the substrate has been processed with the recipe, and a position in a lot of substrates.

6. The method of claim 1, wherein the matrix identifier is generated by a host computer, and wherein underlying substrate data used to generate the matrix identifier is not accessible by the ML and/or AI module.

7. The method of claim 1, wherein the data set has no indication of the one or more substrate properties other than the matrix identifier.

8. The method of claim 1, wherein the data set includes data from sensors in the tool during the processing of one or more substrates with the same matrix identifier.

9. The method of claim 8, wherein the sensors include closed loop sensors and witness sensors.

10. The method of claim 1, wherein the data set includes data from metrology of one or more substrates with the same matrix identifier.

11. A method for building a database used by a machine learning (ML) and/or artificial intelligence (AI) module for processing substrates without knowing underlying substrate properties, comprising:
    associating a matrix identifier with a first substrate, wherein the matrix identifier corresponds to one or more substrate properties of the first substrate, wherein the matrix identifier comprises a matrix with a single row and a plurality of columns, and wherein each column represents a different context parameter;
    storing sensor data from the tool during processing of the first substrate in the database, wherein the sensor data is associated with the matrix identifier;
    modifying a recipe using the stored data; and
    processing subsequent substrates in a tool using the modified recipe.

12. The method of claim 11, further comprising:
    repeating the associating, the processing, and the storing for a plurality of substrates.

13. The method of claim 11, wherein the sensor data comprises control loop sensor data and witness sensor data.

14. The method of claim 11, wherein the sensor data further comprises metrology data of the processed first substrate.

15. The method of claim 11, wherein the plurality of columns includes at least ten columns.

16. The method of claim 11, wherein a plurality of the plurality of columns are populated with an indicator.

17. A semiconductor processing tool, comprising:
    a host computer;
    an artificial intelligence (AI) and/or machine learning (ML) module communicatively coupled to the host computer;
    a database communicatively coupled to the AI and/or ML module; and
    a processing chamber, wherein the processing chamber is operated in accordance with a recipe that is selected by the host computer and modified by the AI and/or ML module in view of a data set within the database, wherein the host computer assigns a matrix identifier to the host computer selected recipe, and wherein the data set used by the AI and/or ML module is associated with the matrix identifier, wherein the matrix identifier comprises a matrix with a single row and a plurality of columns, and wherein each column represents a different context parameter.

* * * * *